United States Patent
Dong et al.

(10) Patent No.: US 10,283,598 B2
(45) Date of Patent: May 7, 2019

(54) III-V HETEROJUNCTION FIELD EFFECT TRANSISTOR

(71) Applicant: Hangzhou Dianzi University, Hangzhou (CN)

(72) Inventors: Zhihua Dong, Hangzhou (CN); Zhiqun Cheng, Hangzhou (CN); Guohua Liu, Hangzhou (CN); Huajie Ke, Hangzhou (CN)

(73) Assignee: Hangzhou Dianzi University, Hangzhou (CN)

( * ) Notice: Subject to any disclaimer, the term of this patent is extended or adjusted under 35 U.S.C. 154(b) by 0 days.

(21) Appl. No.: 15/755,424

(22) PCT Filed: May 2, 2017

(86) PCT No.: PCT/CN2017/082738
§ 371 (c)(1),
(2) Date: Feb. 26, 2018

(87) PCT Pub. No.: WO2017/190643
PCT Pub. Date: Nov. 9, 2017

(65) Prior Publication Data
US 2018/0254326 A1 Sep. 6, 2018

(30) Foreign Application Priority Data
Oct. 27, 2016 (CN) .................... 2016 2 1179373 U (51) Int. Cl.
*H01L 29/78* (2006.01)
*H01L 29/205* (2006.01)
(Continued)

(52) U.S. Cl.
CPC ...... *H01L 29/205* (2013.01); *H01L 29/41766* (2013.01); *H01L 29/42368* (2013.01);
(Continued)

(58) Field of Classification Search
None
See application file for complete search history.

(56) References Cited

U.S. PATENT DOCUMENTS

8,803,158 B1 * 8/2014 Chiu .................. H01L 29/2003
257/194
9,525,054 B2 * 12/2016 Chiang ............... H01L 29/7783
(Continued)

*Primary Examiner* — Minh Loan Tran
(74) *Attorney, Agent, or Firm* — Wang Law Firm, Inc.

(57) ABSTRACT

Disclosed is a novel III-V heterojunction field effect transistor comprising a substrate layer, a first semiconductor layer, a second semiconductor layer, a drain electrode, a source electrode, a gate electrode, a first dielectric layer, second dielectric layers and the like, wherein the first semiconductor layer has a greater bandgap compared with the second semiconductor layer, and the second semiconductor layer and the first semiconductor layer are combined to form a heterostructure. The thickness of the first semiconductor layer is not greater than the critical thickness of two-dimensional electron gas formed in a heterojunction channel, and thus natural 2DEG in the heterojunction channel is depleted. The novel III-V heterojunction field effect transistor has the advantages of being simple in structure, simple in preparation process, stable in performance, high in reliability and the like.

20 Claims, 5 Drawing Sheets

(51) Int. Cl.
  *H01L 29/778* (2006.01)
  *H01L 29/66* (2006.01)
  *H01L 29/417* (2006.01)
  *H01L 29/423* (2006.01)
  *H01L 29/06* (2006.01)

(52) U.S. Cl.
  CPC .. *H01L 29/66431* (2013.01); *H01L 29/66462* (2013.01); *H01L 29/778* (2013.01); *H01L 29/7781* (2013.01); *H01L 29/7786* (2013.01); *H01L 29/7787* (2013.01); *H01L 29/0649* (2013.01); *H01L 29/42316* (2013.01)

(56) References Cited

U.S. PATENT DOCUMENTS

| | | | |
|---|---|---|---|
| 2013/0069129 A1* | 3/2013 | Makiyama | H01L 29/66462 257/288 |
| 2014/0008659 A1* | 1/2014 | Wong | H01L 29/42364 257/76 |
| 2015/0228773 A1* | 8/2015 | Tajiri | H01L 29/7787 257/194 |

* cited by examiner

III-V HETEROJUNCTION FIELD EFFECT TRANSISTOR

BACKGROUND OF THE INVENTION

Technical Field

The application relates to the technical field of semiconductor devices, in particular to a novel III-V heterojunction field effect transistor.

Description of Related Art

Certain binary or ternary compounds (even polycompounds) prepared from group-III elements and group-V elements have spontaneous polarization and piezoelectric polarization effects, and when the binary or ternary compounds (even the polycompounds) are combined to form a heterojunction (such as AlGaN/GaN), high-concentration two-dimensional electron gas (2DEG) can be formed on a heterojunction interface, and a device using the 2DEG on the heterojunction interface as a channel is called a heterojunction field effect transistor (HFET) and can also be called a high electron mobility transistor (HEMT).

Figure 1:
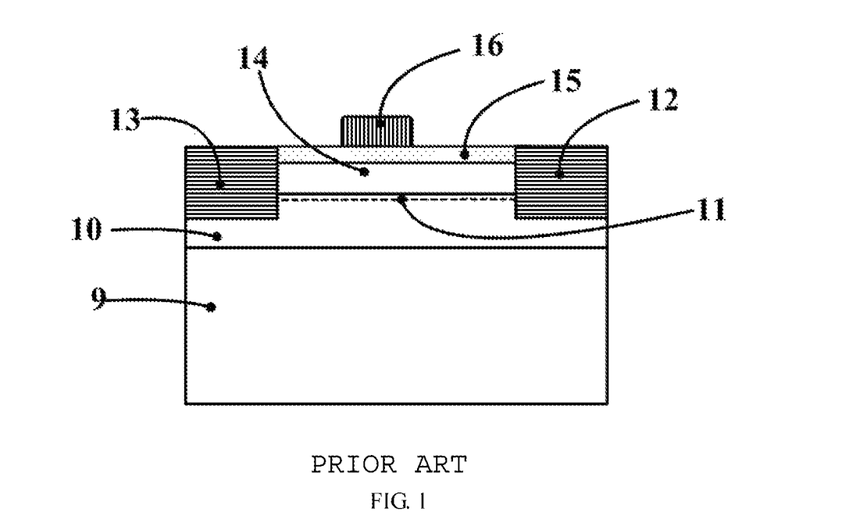
FIG. 1 is a sectional view of a conventional enhancement-mode III-V HFET device in the prior art.

The HFET device has the characteristics of high electron mobility, high operating frequency and high efficiency and has extremely important application in the fields of radio frequency power amplifier and power semiconductor electronics. However, up to now, taking an AlGaN/GaN HFET as an example, the HFET device has a natural defect in that due to extremely powerful spontaneous polarization and piezoelectric polarization, high-concentration 2DEG is formed on the heterojunction interface in the absence of any external voltage, and the HFET device is naturally depleted (normally on). The application of the HFET device to a logical circuit and a power electronic circuit is limited by the defect of the HFET device, the logical circuit needs logic compensation based on a enhancement-mode (normally off) and a depleted (normally on) device, and for ensuring safety and saving energy, the power electronic circuit also needs enhancement-mode (normally off) devices. As is shown in FIG. 1, which is a sectional view of the depleted III-V HFET device in the prior art, the depleted III-V HFET device comprises a substrate layer 9, a second semiconductor layer 10, a first semiconductor layer 14, two-dimensional electron gas 11, a drain electrode 12, a source electrode 13, a gate dielectric layer 15 and a gate electrode 16, wherein the second semiconductor layer 10 and the first semiconductor layer 14 form a heterostructure, and as the thickness of the first semiconductor layer 14 exceeds the critical thickness in the prior art, 2DEG exists on a heterojunction interface, namely the interface between the first semiconductor layer and the second semiconductor layer, due to piezoelectric polarization and spontaneous polarization of the material system under the condition that no external voltage is applied.

In the prior art, an enhancement-mode HFET device is obtained generally through the following several methods:

An F⁻ ion implantation technique for a channel below a gate electrode: specifically, F negative ions are implantation into a barrier layer below the gate electrode, electrons in the channel below the gate electrode are depleted by means of the negative potential, and a positive threshold voltage of the device (namely the enhancement-mode device) is realized.

A trench gate technique: specifically, a barrier layer below a gate electrode is partially thinned through the dry etching technique, and 2DEG below the gate electrode is depleted when the thickness of the barrier layer is smaller than the critical thickness. 2DEG can be induced again only when the gate voltage is higher than a certain voltage, and thus the enhancement-mode device is realized.

As for a device adopting a P—AlGaN layer, the p-AlGaN layer is additionally arranged below a gate electrode, and 2DEG in a channel is depleted under the balancing effect of an energy band.

The techniques mentioned above have different disadvantages; specifically, the F-ion implantation technique has problems in the aspects of ensuring reliability and obtaining a larger threshold value, the trench gate technique has large difficulties in the aspect of process control, and the P—AlGaN technique has the defects of difficult material growth, low switching frequency of the device and the like.

Therefore, it is truly necessary to make a study to provide a scheme to overcome the defects in the prior art.

BRIEF SUMMARY OF THE INVENTION

On this account, the present application mainly aims to provide a novel III-V heterojunction field effect transistor so as to solve the above problems.

One embodiment of the present application provides a novel III-V heterojunction field effect transistor which comprises a substrate layer, a second semiconductor layer, a first semiconductor layer, a drain electrode, a source electrode, a first dielectric layer, second dielectric layers and a gate electrode, wherein, the second semiconductor layer is formed on the substrate layer, the drain electrode and the source electrode are constructed on the second semiconductor layer, and the drain electrode and the source electrode are connected through the first semiconductor layer and are in Ohmic contact with the first semiconductor layer, so that a channel is formed; compared with the second semiconductor layer, the first semiconductor layer has a greater bandgap;

the second semiconductor layer and the first semiconductor layer are combined to form a heterostructure; the thickness of the first semiconductor layer is not greater than the critical thickness of 2DEG formed on the heterostructure, and thus natural 2DEG in the heterostructure is depleted;

the first dielectric layer is further arranged on the surface of the first semiconductor layer, the gate electrode is arranged on the first dielectric layer and covers the channel in the full length direction, and the two edges of the gate electrode extend out of the edges of the sides, close to the channel, of the drain electrode and the source electrode respectively; the second dielectric layers are arranged between the gate electrode and the drain electrode as well as between the gate electrode and the source electrode.

One embodiment of the present application provides a novel III-V heterojunction field effect transistor which comprises a substrate layer, a first semiconductor layer, a second semiconductor layer, a dielectric template layer, a drain electrode, a source electrode, a first dielectric layer, second dielectric layers and a gate electrode, wherein, the second semiconductor layer is formed on the substrate layer, and the drain electrode and the source electrode are constructed on the second semiconductor layer;

the second semiconductor layer and a first semiconductor layer body are combined to form a heterojunction channel, and the two ends of the heterojunction channel are connected with the drain electrode and the source electrode respectively; the thickness of the first semiconductor layer body is not greater than the critical thickness of 2DEG formed on the heterojunction channel, and thus natural 2DEG in the heterojunction channel is depleted;

the first semiconductor layer comprises a body and n parts of protrusions grown along the body, wherein n≥1;

the dielectric template layer is arranged on the first semiconductor layer body and provided with n windows, and the n parts of protrusions are grown along the n windows; through the protrusions, the thickness of the first semiconductor layer exceeds the critical thickness, so that 2DEG is formed in the projection regions of the protrusions, and n parts of 2DEG regions are formed on the heterojunction channel at intervals;

the gate electrode is arranged on the first dielectric layer.

In certain specific implementation schemes, the novel III-V heterojunction field effect transistor is a normally off III-V heterojunction field effect transistor and comprises a substrate layer, a second semiconductor layer, a dielectric template layer, a drain electrode, a source electrode, a first dielectric layer, second dielectric layers and a gate electrode, wherein, the second semiconductor layer is formed on the substrate layer, and the drain electrode and the source electrode are constructed on the second semiconductor layer;

the first semiconductor layer comprises a body and n parts of protrusions grown along the body, wherein n≥1;

the second semiconductor layer and the first semiconductor layer body are combined to form a heterojunction channel, and the two ends of the heterojunction channel are connected with the drain electrode and the source electrode respectively; the thickness of the first semiconductor layer body is not greater than the critical thickness of 2DEG formed on the heterojunction channel, and thus natural 2DEG in the heterojunction channel is depleted;

the dielectric template layer is arranged on the first semiconductor layer body and provided with n windows, and the n parts of protrusions are grown on the first semiconductor layer body along the n windows; through the protrusions, the thickness of the first semiconductor layer exceeds the critical thickness, so that 2DEG is formed in the projection regions of the protrusions, and n parts of 2DEG regions are formed on the heterojunction channel at intervals;

the first dielectric layer is further arranged on the surface of the first semiconductor layer, the gate electrode is arranged on the first dielectric layer and covers the channel in the full length direction, and the two edges of the gate electrode extend out of the edges of the sides, close to the channel, of the drain electrode and the source electrode respectively; the second dielectric layers are arranged between the gate electrode and the drain electrode as well as between the gate electrode and the source electrode.

In certain specific implementation schemes, a dielectric wall is distributed at least between two adjacent windows in the dielectric template layer and is only distributed in an area which can be covered by the projection of the gate electrode, the number of the dielectric walls is n, n≥1, and the dimension of at least one dielectric wall in the gate width direction is equal to or greater than the gate width; the protrusions are grown on the first semiconductor layer body along the outer sides of the dielectric walls; through the protrusions, the thickness of the first semiconductor layer exceeds the critical thickness, so that 2DEG is formed in the projection regions of the protrusions, and at least two discontinuous 2DEG regions, namely the connected parts of the edges of the source electrode and the drain electrode, are formed on the heterojunction channel;

the gate electrode is arranged on the first semiconductor layer and only covers two-dimensional electron gas interruption parts in the whole heterojunction channel.

Compared with the prior art, the novel III-V heterojunction field effect transistor provided by the present application has the advantages of simpler structure, simpler preparation flows, stabler performance, higher reliability and the like.

DETAILED DESCRIPTION OF THE INVENTION

Through a continuous and deep study on the structure of an HFET device in the prior art, the inventor of the present application realizes that as the thickness of a barrier layer, namely the thickness of a first semiconductor layer, of the conventional device exceeds the critical thickness, high-concentration 2DEG exists on a heterojunction interface, namely the interface between the first semiconductor layer and a second semiconductor layer, due to piezoelectric polarization and spontaneous polarization of the material system under the condition that no external voltage is applied. Special techniques such as the trench gate technique and the F⁻ ion implantation and doping technique have to be adopted for obtaining an enhancement-mode device. All the techniques have the defects of difficult accurate control and prolonged technological cycles; in addition, for a trench gate structure, the etching technique is adopted in the technological process, a channel of the device is damaged, consequentially, the performance of the device is affected, and potential hazards exist in the reliability of the device. The F⁻ ion implantation technique cannot achieve accurate control easily and has potential hazards in the reliability.

On account of the defects of the existing HFET device, the inventor of the present application provides the technical scheme of the present application through long-term study and mass practice, and the technical scheme is explained and illustrated in detail as follows.

One embodiment of the present application provides a novel III-V heterojunction field effect transistor which is an enhancement-mode III-V heterojunction field effect transistor and comprises a substrate layer, a second semiconductor layer, a first semiconductor layer, a drain electrode, a source electrode, a first dielectric layer, second dielectric layers and a gate electrode, wherein, the second semiconductor layer is formed on the substrate layer, the drain electrode and the source electrode are constructed on the second semiconductor layer, and the drain electrode and the source electrode are connected through the first semiconductor layer and are in Ohmic contact with the first semiconductor layer, so that a channel is formed; compared with the second semiconductor layer, the first semiconductor layer has a greater bandgap;

the second semiconductor layer and the first semiconductor layer are combined to form a heterostructure; the thickness of the first semiconductor layer is not greater than the critical thickness of 2DEG formed on the heterostructure, and thus natural 2DEG in the heterostructure is depleted;

the first dielectric layer is further arranged on the surface of the first semiconductor layer, the gate electrode is arranged on the first dielectric layer and covers the channel in the full length direction, and the two edges of the gate electrode extend out of the edges of the sides, close to the channel, of the drain electrode and the source electrode respectively; the second dielectric layers are arranged between the gate electrode and the drain electrode as well as between the gate electrode and the source electrode.

Preferably, the second dielectric layers are only located on the edges, overlapping with the drain electrode and the source electrode, of the gate electrode.

Preferably, an intermediate layer used for improving the mobility of two-dimensional electron gas on the heterojunction interface is further arranged between the first semiconductor layer and the second semiconductor layer.

Preferably, the thickness of the intermediate layer can be about 1 nm.

Preferably, the intermediate layer is an AlN layer.

Preferably, the first semiconductor layer is an AlGaN layer or an AlN layer.

Preferably, the second semiconductor layer is a GaN layer.

For example, in certain implementation schemes, the first semiconductor layer is an AlGaN layer, and the thickness of the first semiconductor layer is smaller than or equal to 5 nm and preferably is 1~5 nm; the second semiconductor layer is a GaN layer, and the thickness of the second semiconductor layer can be any suitable numerical value such as 2 μm.

For example, in certain specific implementation schemes, the first semiconductor layer is an AlN layer, and the thickness of the first semiconductor layer is 5 nm; the second semiconductor layer is a GaN layer, and the thickness of the second semiconductor layer is 2 μm.

Preferably, the first dielectric layer is a $Si_3N_4$ layer which is grown in situ when a heterostructure material is grown, and the thickness of the first dielectric layer is 5~25 nm.

Preferably, a third dielectric layer is further arranged between the gate electrode and the first dielectric layer and used for further decreasing leakage currents of the gate electrode of the device.

Preferably, each second dielectric layer comprises a $SiO_2$ layer. In certain specific implementation schemes, the thickness of each dielectric layer can be 100 nm.

Preferably, the edges of the sides, towards the channel, of the second dielectric layers are beyond the drain electrode and the source electrode respectively by the length of 0~2 μm and preferably by the length of 0.5 μm.

Preferably, the distance between the drain electrode and the source electrode can be about 2.5 μm.

According to the novel enhancement-mode III-V heterojunction field effect transistor provided in the above embodiment of the present application, the depleted channel is obtained through a thin barrier layer, an MIS gate structure is adopted, 2DEG is induced again by means of high gate voltage, and thus the enhancement-mode device with stable performance is realized.

Figure 2:
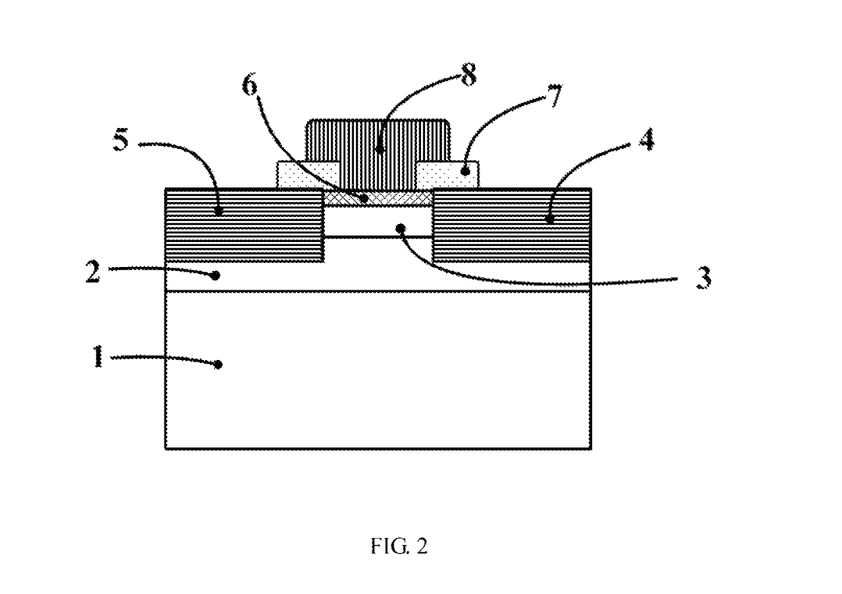
FIG. 2 is a sectional view of a novel enhancement-mode III-V heterojunction field effect transistor of the present application.
Figure 3:
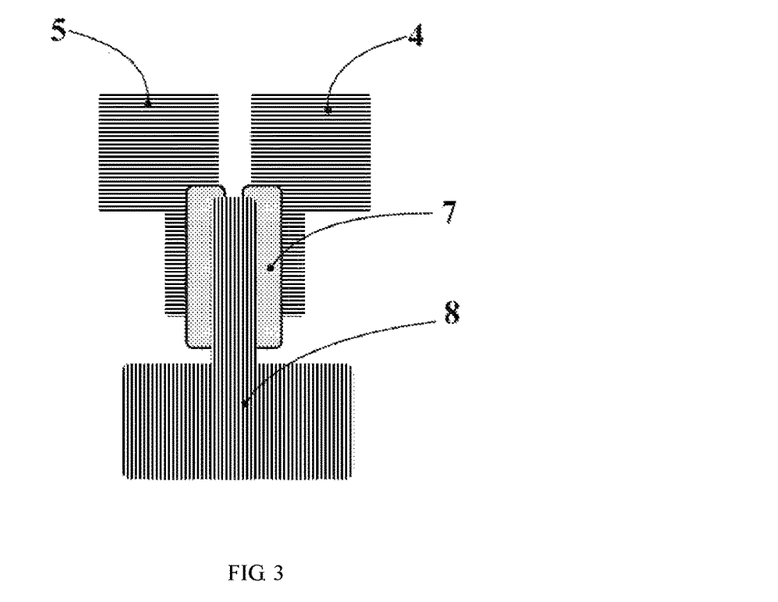
FIG. 3 is a top view of the novel enhancement-mode III-V heterojunction field effect transistor of the present application.

In certain more specific implementation schemes of the above embodiment, the structure of the novel enhancement-mode III-V heterojunction field effect transistor is shown in FIG. 2 and FIG. 3, wherein FIG. 2 is a sectional view of the device, and FIG. 3 is a top view of the device.

Wherein, the novel enhancement-mode III-V heterojunction field effect transistor comprises a substrate layer 1, a second semiconductor layer 2, a first semiconductor layer 3, a drain electrode 4, a source electrode 5, a first dielectric layer 6, second dielectric layers 7 and a gate electrode 8, wherein, the second semiconductor layer 2 is formed on the substrate layer 1, the drain electrode 4 and the source electrode 5 are constructed on the second semiconductor layer 2, and the drain electrode 4 and the source electrode 5 are connected through the first semiconductor layer 3 and are in Ohmic contact with the first semiconductor layer 3, so that a channel is formed; compared with the second semiconductor layer 2, the first semiconductor layer 3 has a greater bandgap;

the second semiconductor layer 2 and the first semiconductor layer 3 are combined to form a heterostructure; the thickness of the first semiconductor layer 3 is not greater than the critical thickness of 2DEG formed on the heterostructure, and thus natural 2DEG in the heterostructure of the first semiconductor layer 3 is depleted; the first semiconductor layer of a thin structure is designed, and the thickness of the first semiconductor layer is smaller than the critical thickness, so that the high-concentration 2DEG naturally exists on the heterostructure is eliminated; in this way, in the absence of an external gate voltage, no 2DEG exists on the heterojunction interface of the first semiconductor layer and the second semiconductor layer, high-concentration 2DEG can be induced from the channel only when an external gate voltage exceeds a certain positive threshold voltage, an enhancement-mode form is formed, and accordingly the process for forming the enhancement-mode device is greatly simplified.

The first dielectric layer 6 is further arranged on the surface of the first semiconductor layer 3, the gate electrode 8 is arranged on the first dielectric layer 6 and covers the channel in the full length direction, and the two edges of the gate electrode 8 extend out of the edges of the sides, close to the channel, of the drain electrode 4 and the source electrode 5 respectively; the second dielectric layers 7 are arranged between the gate electrode 8 and the drain electrode 4 as well as between the gate electrode 8 and the source electrode 5. As the gate electrode structurally covers the channel completely, 2DEG in the channel can be completely controlled by the gate voltage, and the device free of current collapse is realized.

In one preferred embodiment, the second dielectric layers 7 are only located on the edges, overlapping with the drain electrode 4 and the source electrode 5, of the gate electrode 8. The second dielectric layers 7 are used for preventing electrical connection between the gate electrode 8 and the drain electrode 4 as well as between the gate electrode 8 and the source electrode 5, however, the second dielectric layers 7 also have an influence on the gate capacitance, and then the gate control capacity and the amplifying capacity are affected. Compared with a structure that a second dielectric layer completely covers a first dielectric layer, the structure that the second dielectric layers 7 only cover the edges, overlapping with the drain electrode 4 and the source electrode 5, of the gate electrode 8 can ensure a greater gate capacitance on the premise of achieving good electrical isolation, a higher device transconductance is realized, and the device has higher gate control capacity and greater amplifying capacity. Preferably, the thicknesses of the second dielectric layers should be as small as possible, so that the second dielectric layers are extremely thin under the orthographic projection of the gate electrode, and the loss of the gate capacitance is minimized.

Meanwhile, the realizing technique for the novel enhancement-mode III-V heterojunction field effect transistor is basically the same as the technique for the HFET in the prior art, and the technique complexity of the device is not increased at all. The device of the present application can be realized through the following main technological steps:

(1) Growth of a substrate material, specifically, a corresponding buffer layer, the second semiconductor layer, the first semiconductor layer and an in-situ $Si_3N_4$ layer are grown on the suitable substrate material (such as an Si substrate) according to the material growth law, and the intermediate layer is selectively grown on the substrate material.

(2) Cleaning of the substrate material, specifically, a proper cleaning scheme is adopted, and thus a clean material surface is obtained;

(3) Preparation of the source electrode and the drain electrode.

(4) Growth of the second dielectric layers.

(5) Etching of selected zones of the second gate dielectric layers.

(6) Preparation of the gate electrode.

(7) Passivating and packaging.

In the above embodiment of the present application, by adoption of the technical scheme, the technique complexity of the device is not increased at all, the threshold voltage can be set by setting parameters such as the thickness of the first semiconductor layer and the thickness of the first dielectric layer, repeatability of the technique for the device is achieved, and industrial production of the device is facilitated.

The novel enhancement-mode III-V heterojunction field effect transistor provided in one embodiment of the present application is a normally off III-V heterojunction field effect transistor and comprises a substrate layer, a first semiconductor layer, a second semiconductor layer, a dielectric template layer, a drain electrode, a source electrode, a first dielectric layer, second dielectric layers and a gate electrode, wherein, the second semiconductor layer is formed on the substrate layer, and the drain electrode and the source electrode are constructed on the second semiconductor layer;

the first semiconductor layer comprises a body and n parts of protrusions grown along the body, wherein $n \geq 1$;

the second semiconductor layer and the first semiconductor layer body are combined to form a heterojunction channel, and the two ends of the heterojunction channel are connected with the drain electrode and the source electrode respectively; the thickness of a first semiconductor layer body is not greater than the critical thickness of 2DEG formed on the heterojunction channel, and thus natural 2DEG in the heterojunction channel is depleted;

the dielectric template layer is arranged on the first semiconductor layer body and provided with n windows at equal intervals, and the n parts of protrusions are grown on the first semiconductor layer body along the n windows; through the protrusions, the thickness of the first semiconductor layer exceeds the critical thickness, so that 2DEG is formed in the projection regions of the protrusions, and n 2DEG regions are formed on the heterojunction channel at equal intervals.

The first dielectric layer is further arranged on the surface of the first semiconductor layer, the gate electrode is arranged on the first dielectric layer and covers the channel in the full length direction, and the two edges of the gate electrode extend out of the edges of the sides, close to the channel, of the drain electrode and the source electrode respectively; the second dielectric layers are arranged between the gate electrode and the drain electrode as well as between the gate electrode and the source electrode.

Preferably, the protrusions are distributed continuously or are divided into m parts in the growth direction, wherein $m \geq 1$.

Preferably, the second dielectric layers are only located on the edges, overlapping with the drain electrode and the source electrode, of the gate electrode.

Preferably, an intermediate layer used for improving the mobility of two-dimensional electron gas on the heterojunction interface is further arranged between the first semiconductor layer and the second semiconductor layer.

Preferably, the intermediate layer is an AlN layer.

Preferably, the first semiconductor layer is an AlGaN layer or an AlN layer, and the second semiconductor layer is a GaN layer.

Preferably, the first dielectric layer is a $Si_3N_4$ layer which is grown in situ when a heterostructure material is grown, and the thickness of the first dielectric layer is 5~25 nm.

Preferably, the dielectric template layer comprises a $SiO_2$ layer such as a $SiO_2$ layer grown through LPCVD.

Preferably, each second dielectric layer is a $SiO_2$ layer.

Preferably, the edges of the sides, towards the channel, of the second dielectric layers are beyond the drain electrode and the source electrode respectively by the length of 0.5 μm.

According to the novel normally off III-V heterojunction field effect transistor provided in the above embodiment of the present application, the discontinuous channel is obtained through a specially designed barrier layer, and 2DEG is induced again through a high gate voltage, so that the normally off device with stable performance is realized, and flexible and diversified design schemes can be adopted according to the performance requirement of the device.

Figure 4:
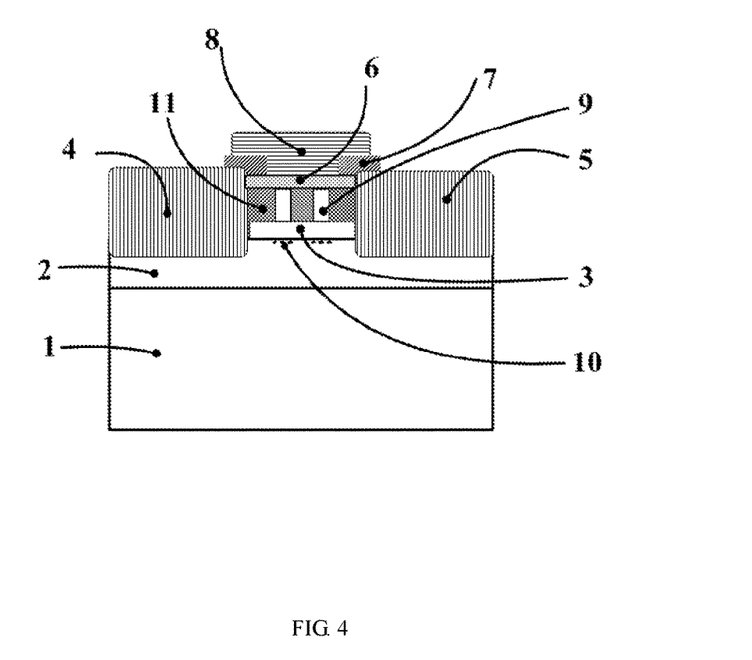
FIG. 4 is a sectional view of a novel enhancement-mode III-V heterojunction field effect transistor of the present application.
Figure 5:
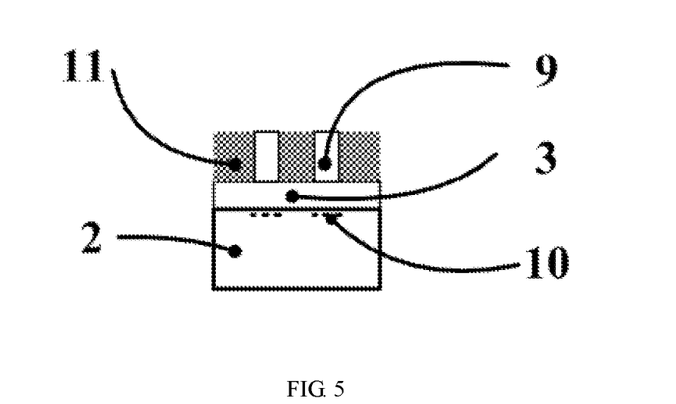
FIG. 5 is a front view of a first semiconductor part, a second semiconductor part and a dielectric template part of the novel enhancement-mode III-V heterojunction field effect transistor of the present application when n=3, and m=1.
Figure 6:
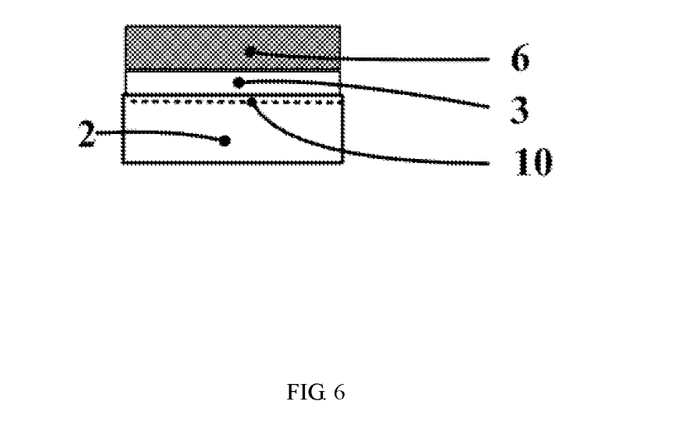
FIG. 6 is a left view of the first semiconductor part, the second semiconductor part and the dielectric template part of the novel enhancement-mode III-V heterojunction field effect transistor of the present application when n=3, and m=1.
Figure 7:
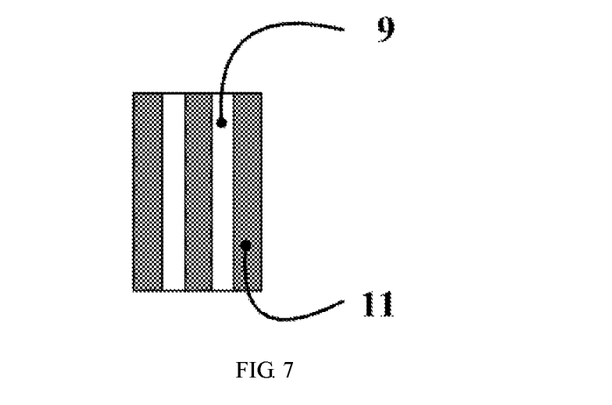
FIG. 7 is a top view of the first semiconductor part, the second semiconductor part and the dielectric template part of the novel enhancement-mode III-V heterojunction field effect transistor of the present application when n=3, and m=1.

In certain more specific implementation schemes of the above embodiment, the structure of the novel enhancement-mode III-V heterojunction field effect transistor is shown in FIG. 4, FIG. 5, FIG. 6 and FIG. 7, wherein FIG. 4 is a sectional view of the device, FIGS. 5 and 6 are three views of the first semiconductor part, the second semiconductor part and the dielectric template part when n=2, and m=1 respectively, FIG. 5 is a left view, FIG. 6 is a front view, and FIG. 7 is a top view. The novel normally off III-V heterojunction field effect transistor of the present application comprises a substrate layer 1, a second semiconductor layer 2, a first semiconductor layer body 3, first semiconductor layer protrusions 9, two-dimensional electron gas 10, a dielectric template layer 11, a first dielectric layer 6, second dielectric layers 7, a gate electrode 8, a drain electrode 4 and a source electrode 5.

Wherein, the second semiconductor layer 2 is formed on the substrate layer 1, the drain electrode 5 and the source electrode 4 are constructed on the second semiconductor layer 2, the first semiconductor layer body 3 is formed on the second semiconductor layer 2, and the first semiconductor layer body 3 and the second semiconductor layer 2 are combined to form a heterojunction channel; the drain electrode 5 and the source electrode 4 are connected through a channel formed between the first semiconductor layer body 3 and the second semiconductor layer 2; compared with the second semiconductor layer, the first semiconductor layer has a greater bandgap; the thickness of the first semiconductor layer body 3 is not greater than the critical thickness of 2DEG formed on the heterostructure.

The dielectric template layer 6 is constructed on the first semiconductor layer body 3 and provided with n windows at equal intervals, and the n parts of protrusions 4 are grown on the first semiconductor layer body 3 along the n windows; through the protrusions, the thickness of the first semiconductor layer exceeds the critical thickness, so that 2DEG is formed in the projection regions of the protrusions, and n 2DEG regions are formed on the heterojunction channel at equal intervals.

If only the first semiconductor layer body 3 exists, 2DEG cannot be generated in the heterostructure; due to the presence of the first semiconductor layer protrusions 4, the total thickness of the first semiconductor layer body 3 and the first semiconductor layer protrusions 4 is greater than the critical thickness for generating 2DEG and thus 2DEG exists on the heterojunction interface below the first semiconductor layer protrusions 4. Accordingly, discontinuous 2DEG is distributed on the heterojunction interface. As the 2DEG is discontinuous, no conductive channel is formed in the absence of a gate voltage, and the HFET device is normally off. The 2DEG on the heterojunction interface can be continuous only when the gate voltage is greater than a threshold voltage, and thus the conductive channel is formed.

By adoption of the above technical scheme, the gate electrode of the device completely covers the channel between the source electrode and the drain electrode, so that when the device operates, the gate voltage can completely control the channel, instant on-off of the channel is achieved, and thus current collapse can be avoided to the maximum extent.

In addition, although the gate electrode of the device covers the channel between the source electrode and the drain electrode, two-dimensional electron gas exists on the first semiconductor layer protrusions always, the equivalent gate length of the device only equals to the length of the total protrusions of the first semiconductor layer, and thus the device has a high cut-off frequency. Meanwhile, as the breakdown voltage of the device is in positive correlation with the distance between the source electrode and the drain electrode, the device can also have a high breakdown voltage.

The first dielectric layer 6 is further arranged on the surface of the first semiconductor layer, the gate electrode 8 is arranged on the first dielectric layer 6 and covers the channel in the full length direction, and the two edges of the gate electrode 8 extend out of the edges of the sides, close to the channel, of the drain electrode 4 and the source electrode 5 respectively; the second dielectric layers 7 are arranged between the gate electrode 8 and the drain electrode 4 as well as between the gate electrode 8 and the source electrode 5. As the gate electrode structurally covers the channel completely, 2DEG in the channel can be completely controlled by the gate voltage, and the device free of current collapse is realized.

In a preferred embodiment, in the direction perpendicular to the connection direction of the source electrode and the drain electrode, the first semiconductor layer protrusions 9 can be distributed continuously and can also be divided into m parts. The dielectric template 6 is discontinuous in the direction from the source electrode to the drain electrode.

In a preferred embodiment, the second dielectric layers 7 are only located on the edges, overlapping with the drain electrode 5 and the source electrode 4, of the gate electrode 8. The second dielectric layers 7 are used for preventing electrical connection between the gate electrode 8 and the drain electrode 5 as well as between the gate electrode 8 and the source electrode 4, however, the second dielectric layers 7 also have an influence on the gate capacitance, and then the gate control capacity and the amplifying capacity are affected. Compared with a structure that a second dielectric layer completely covers a first dielectric layer, the structure that the second dielectric layers 7 only cover the edges, overlapping with the drain electrode 5 and the source electrode 4, of the gate electrode 8 can ensure a greater gate capacitance on the premise of achieving good electrical isolation, a greater device transconductance is realized, and the device has higher gate control capacity and higher amplifying capacity. Preferably, the thicknesses of the second dielectric layers should be as small as possible, so that the second dielectric layers are extremely thin under the orthographic projection of the gate electrode, and the loss of the gate capacitance is minimized.

Meanwhile, the realizing technique for the novel enhancement-mode III-V heterojunction field effect transistor is basically the same as the technique for the HFET in the prior art, and the technique complexity of the device is not increased at all. The device of the present application can be realized through the following main technological steps:

(1) Growth of a substrate material, specifically, a corresponding buffer layer, the second semiconductor layer, the first semiconductor layer body 3 and the dielectric template layer 6 are grown on the suitable substrate material (such as a Si substrate) according to the material growth law, and the intermediate layer is selectively grown on the substrate material.

(2) Formation of the windows grown along the first semiconductor layer protrusions 9 through photolithography and etching of the dielectric template layer.

(3) Growth of the first semiconductor layer protrusions 9.

(4) Preparation of the source electrode and the drain electrode.

(5) Growth of the first dielectric layer.

(6) Growth of the second dielectric layers and etching in selected regions.

(7) Preparation of the gate electrode.

(8) Passivation.

In the above embodiment of the present application, by adoption of the technical scheme, the normally off device can be realized; as the channel material of the device is obtained through growing instead of etching adopted for a trench gate device, damage to the heterojunction interface is avoided, and thus the performance of the device can be improved easily.

The novel III-V heterojunction field effect transistor provided in one embodiment of the present application is a normally off III-V heterojunction field effect transistor structurally provided with a composite barrier layer and comprises a substrate layer, a second semiconductor layer, dielectric walls (also regarded as dielectric template layers of another form), a drain electrode, a source electrode and a gate electrode, wherein, the second semiconductor layer is formed on the substrate layer, and the drain electrode and the source electrode are constructed on the second semiconductor layer;

the second semiconductor layer and the first semiconductor layer body are combined to form a heterojunction channel, and the two ends of the heterojunction channel are connected with the drain electrode and the source electrode respectively; the thickness of the first semiconductor layer body is not greater than the critical thickness of 2DEG formed on the heterojunction channel, and thus natural 2DEG in the heterojunction channel is depleted.

The dielectric walls are arranged on the first semiconductor layer body and are only distributed in the area which can be covered by the projection of the gate electrode, the number of the dielectric walls is n, n≥1, and the dimension of at least one dielectric wall in the gate width direction is equal to or greater than the gate width; protrusions are grown on the first semiconductor layer body along the outer sides of the dielectric walls; through the protrusion, the thickness of the first semiconductor layer exceeds the critical thickness, so that 2DEG is formed in the projection regions of the protrusions, and at least two discontinuous 2DEG regions, namely the connected parts of the edges of the source electrode and the drain electrode, are formed on the heterojunction channel at equal intervals.

The gate electrode is arranged on the first semiconductor layer and only covers two-dimensional electron gas interruption parts in the whole heterojunction channel.

In certain implementation schemes of the above embodiment, the first dielectric layer is further arranged between the gate electrode and the first semiconductor layer.

In certain implementation schemes of the above embodiment, the protrusions are distributed continuously in the area covered by the projection of the gate electrode or are divided into m parts in the growth direction, wherein m≥1.

In certain implementation schemes of the above embodiment, an intermediate layer which is used for improving the mobility of 2DEG on the heterojunction interface is further arranged between the first semiconductor layer and the second semiconductor layer.

The intermediate layer is, but not limited to, an AlN layer.

In certain implementation schemes of the above embodiment, the first semiconductor layer can be, but is not limited to an AlGaN layer, an AlN layer and the like.

In certain implementation schemes of the above embodiment, the second semiconductor layer can be, but is not limited to, a GaN layer.

In certain implementation schemes of the above embodiment, the first dielectric layer is a $Si_3N_4$ layer which is grown in situ when a heterostructure material is grown. Preferably, the thickness of the first dielectric layer is 5~25 nm.

In certain implementation schemes of the above embodiment, n windows are formed on the dielectric walls through the photolithography and etching technique.

Figure 8:
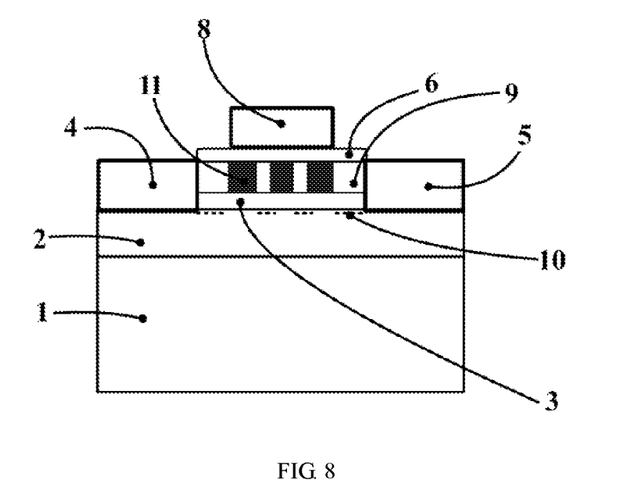
FIG. 8 is a sectional view of a enhancement-mode III-V heterojunction field effect transistor structurally provided with a composite barrier layer of the present application.
Figure 9:
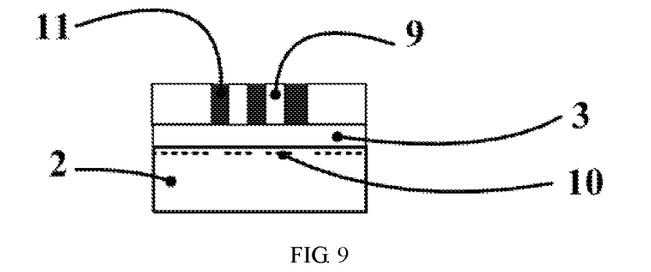
FIG. 9 is a front view of a first semiconductor part, a second semiconductor part and a dielectric wall part of the enhancement-mode III-V heterojunction field effect transistor structurally provided with the barrier layer in the present application when n=3, and m=2.
Figure 10:
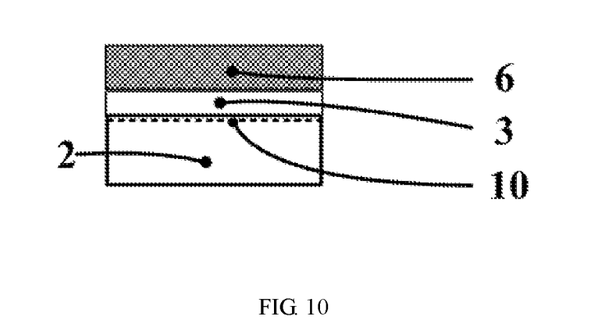
FIG. 10 is a left view of the first semiconductor part, the second semiconductor part and the dielectric wall part of the enhancement-mode III-V heterojunction field effect transistor structurally provided with the barrier layer in the present application when n=3, and m=2.
Figure 11:
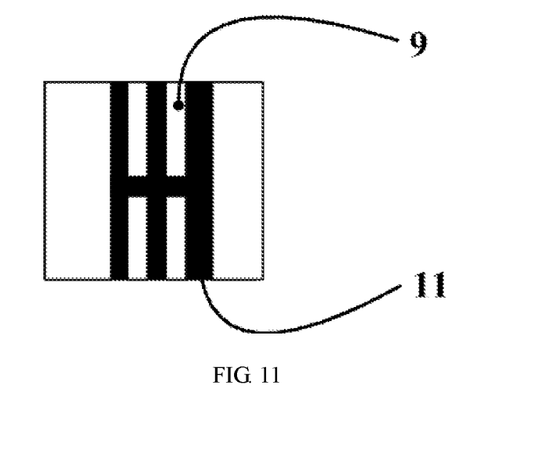
FIG. 11 is a top view of the first semiconductor part, the second semiconductor part and the dielectric wall part of the enhancement-mode III-V heterojunction field effect transistor structurally provided with the barrier layer in the present application when n=3, and m=2.

A specific implementation scheme of the above embodiment is shown in FIGS. 8 to 11 and relates to the enhancement-mode III-V heterojunction field effect transistor structurally provided with the composite barrier layer (called the device for short in the following description). FIG. 8 is a sectional view of the device, FIGS. 9 to 11 are three views of the first semiconductor part, the second semiconductor part and the dielectric wall part when n=2 and m=2, FIG. 9 is a front view, FIG. 10 is a left view, and FIG. 11 is a top view. Furthermore, the device comprises a substrate layer 1, a second semiconductor layer 2, a first semiconductor layer body 3, first semiconductor layer protrusions 9, two-dimensional electron gas 10, dielectric template layer 11, a first dielectric layer 6, a gate electrode 8, a source electrode 5 and a drain electrode 4.

Wherein, the second semiconductor layer 2 is formed on the substrate layer 1, the drain electrode 4 and the source electrode 5 are constructed on the second semiconductor layer 2, the first semiconductor layer body 3 is formed on the second semiconductor layer 2, and the first semiconductor layer body 3 and the second semiconductor layer 2 are combined to form a heterostructure; the drain electrode 5 and the source electrode 4 are connected through a channel formed between the first semiconductor layer body 3 and the second semiconductor layer 2; compared with the second semiconductor layer, the first semiconductor layer has a greater bandgap; the thickness of the first semiconductor layer body 3 is not greater than the critical thickness of 2DEG formed on the heterostructure.

The dielectric layer is constructed on the first semiconductor layer body 3, the dielectric template layer 11 are constructed through the photolithography or and etching technique, and the protrusions 9 are grown on the first semiconductor layer body 3 along the outer sides of the dielectric walls; through the protrusions, the thickness of the first semiconductor layer exceeds the critical thickness, so that 2DEG is formed in the projection regions of the protrusions, and 2DEG regions are formed on the heterojunction channel at intervals.

If only the first semiconductor layer body 3 exists, 2DEG cannot be generated in the heterostructure; due to the presence of the first semiconductor layer protrusions 9, the total thickness of the first semiconductor layer body 3 and the first semiconductor layer protrusions 9 is greater than the critical thickness for generating 2DEG and thus 2DEG exits on the heterojunction interface below the first semiconductor layer protrusions 9. Accordingly, discontinuous 2DEG is distributed on the heterojunction interface. As the 2DEG is discontinuous, no conductive channel is formed in the absence of a gate voltage, and the HFET device is normally off. The 2DEG on the heterojunction interface can be continuous only when the gate voltage is greater than a threshold voltage, and thus the conductive channel is formed.

In the above embodiment of the present application, the dielectric walls are only distributed in the area covered by the projection of the gate electrode, namely the first semiconductor layer protrusions are grown on the connected parts of the drain electrode and the source electrode, so that 2DEG is formed on the parts, close to the source electrode and the drain electrode, of the heterojunction channel, and on-off state of the heterojunction channel can be controlled only by covering the 2DEG interruption parts in the whole heterojunction channel with the gate electrode, Therefore, for the device in the above embodiment, the gate electrode does not need to be isolated from the drain electrode or the source electrode through dielectric layers, the production technique is greatly simplified, and meanwhile, the breakdown voltage of the transistor is greatly improved.

In one preferred embodiment, the first dielectric layer 6 is further arranged on the surface of the first semiconductor layer, the gate electrode 8 is arranged on the first dielectric layer 6, the gate electrode 8 covers the two-dimensional electron gas interruption parts in the whole composite barrier layer, and thus it is ensured that the source electrode and the drain electrode are connected through 2DEG when a certain gate voltage is applied to the device.

In one preferred embodiment, in the direction perpendicular to the connection direction of the source electrode and the drain electrode, the first semiconductor layer protrusions 9 can be distributed continuously and can also be divided into m parts. The device can be designed extremely flexibly. Meanwhile, the realizing technique for the novel enhancement-mode III-V heterojunction field effect transistor is basically the same as the technique for the HFET in the prior art, and the technique complexity of the device is not increased at all. The device of the present application can be realized through the following main technological steps:

(1) Growth of a substrate material, specifically, a corresponding buffer layer, the second semiconductor layer and the first semiconductor layer body 3 are grown on the suitable substrate material (such as an Si substrate) according to the material growth law, an intermediate layer is selectively grown on the substrate material, and dielectric layers required by the dielectric walls 11' are constructed.

(2) Formation of the dielectric template layer 11 through photolithography and etching on the dielectric layers;

(3) Growth of the first semiconductor layer protrusions 9.

(4) Preparation of the source electrode and the drain electrode.

(5) Growth of the first dielectric layer.

(6) Preparation of the gate electrode.

(7) Device passivation.

By adoption of the above technical scheme, the normally off device can be realized; in addition, as the channel material of the device is obtained through growing instead of etching adopted for a trench gate device, damage to the heterojunction interface is avoided, and the performance of the device can be improved.

According to the normally off III-V heterojunction field effect transistor structurally provided with the composite barrier layer provided in the above embodiment of the present application, the discontinuous channel is obtained through the specially designed barrier layer, 2DEG is induced again through a high gate voltage, and thus the normally off device with the stable performance is realized. In addition, flexible and diversified design schemes can be adopted according to the performance requirement of the device. Meanwhile, since the gate electrode only covers the two-dimensional electron gas interruption parts in the whole heterojunction channel, the breakdown voltage of the transistor is greatly improved.

A further description of the of the technical scheme of the invention is given with several preferred embodiments and corresponding accompanying drawings as follows, however, the present application is not limited to the embodiments.

First Embodiment

For a novel enhancement-mode III-V heterojunction field effect transistor in the embodiment, a substrate material comprises a Si material and a low-temperature AlN buffer layer grown on the Si material, a second semiconductor layer (with the thickness of about 2 μm) is a GaN layer, a first semiconductor layer (with the thickness of about 1~5 nm) is an AlGaN layer, and an AlN intermediate layer (with the thickness of about 1 nm) is arranged between the first semiconductor layer and the second semiconductor layer and used for improving the electrical property of 2DEG A first dielectric layer is a $Si_3N_4$ layer which is grown in situ, and the thickness of the first dielectric layer is about 5~25 nm. A source electrode and a drain electrode are all formed by Ti/Al/Ni/Au (20/120/50/200 nm) through metal deposition and high-temperature thermal annealing, and the distance between the source electrode and the drain electrode is 2.5 μm. Each second dielectric layer is a $SiO_2$ layer, and the thickness of each second dielectric layer is about 100 nm. The edges of the sides, towards the center of a channel, of the second dielectric layers are beyond the source electrode and the drain electrode respectively by the length of 0.5 μm. A gate electrode is prepared from Ni/Au (50/150 nm). The preparation process of the device comprises the following steps that firstly, the low-temperature AlN buffer layer is grown on the substrate material containing Si then the second semiconductor layer which is a GaN layer is grown, then the first semiconductor AlGaN layer is grown, and a $Si_3N_4$ layer is grown in situ to serve as the first dielectric layer; secondly, the first dielectric layer at the position of the source electrode and the drain electrode is etched, and Ohmic contact is prepared; thirdly, the second dielectric layers are grown, and the second dielectric layers are only left on the edges of the source electrode and the drain electrode through photolithography and etching; and finally, the gate electrode is prepared.

Second Embodiment

For a novel enhancement-mode III-V heterojunction field effect transistor in the embodiment, a substrate material comprises a SiC material and a low-temperature AlN layer grown on the SiC material, a second semiconductor layer (with the thickness of about 2 μm) is a GaN layer, a first semiconductor layer (with the thickness of about 5 nm) is an AlN layer, a first dielectric layer is a $Si_3N_4$ layer which is grown in situ, and the thickness of the first dielectric layer is about 5-25 nm. A source electrode and a drain electrode are all formed by Ti/Al/Ni/Au (20/120/50/200 nm) through metal deposition and high-temperature thermal annealing, and the distance between the source electrode and the drain electrode is 2.5 μm. Each second dielectric layer is a $SiO_2$ layer, and the thickness of each second dielectric layer is about 100 nm. The edges of the sides, towards the center of a channel, of the second dielectric layers are beyond the source electrode and the drain electrode respectively by the length of 0.5 μm. A gate electrode is prepared from Ni/Au (50/150 nm).

Third Embodiment

For a novel normally off III-V heterojunction field effect transistor in the embodiment, a substrate material comprises a Si material and a low-temperature AlN buffer layer grown on the Si material, a second semiconductor layer (with the thickness of about 2 μm) is a GaN layer, the first part (with the thickness of about 3 nm) of a first semiconductor layer is an AlGaN layer, an AlN intermediate layer (with the thickness of about 1 nm) is arranged between the first semiconductor layer and the first part of the second semiconductor layer and used for improving the electrical property of 2DEG. A dielectric template layer is a $SiO_2$ layer which is grown through low-pressure chemical vapor deposition (LPCVD). n, the number of windows on the dielectric template layer is two, then m is one. The length of each window in the connection direction of a source electrode and a drain electrode is 0.5 μm, and the length of each window in the direction perpendicular to the direction of the connection direction of the source electrode and the drain electrode is 100 μm. A first dielectric layer is a $Si_3N_4$ layer which is grown in situ, and the thickness of the first dielectric layer is about 10 nm; each second dielectric layer is an $hfO_2$ layer, and the thickness of each second dielectric layer is 100 nm. The source electrode and the drain electrode are all formed by Ti/Al/Ni/Au (20/120/50/200 nm) through metal deposition and high-temperature thermal annealing. The distance between the source electrode and the drain electrode is 2.5 μm. The edges of the sides, towards the center of a channel, of the second dielectric layers are beyond the source electrode and the drain electrode respectively by the length of 0.5 μm. A gate electrode is prepared from Ni/Au (50/150 nm). The preparation process of the device comprises the following steps that firstly, the low-temperature AlN buffer layer is grown on the Si substrate material, then the second semiconductor layer which is a GaN layer is grown, then the body part of the first semiconductor AlGaN layer is grown, then the dielectric template layer which is a $SiO_2$ layer is grown through low-pressure chemical vapor deposition (LPCVD), dielectric walls are reserved through photoeching and etching techniques, the secondary epitaxial windows are exposed, then the material is placed into a material growing device again, and protrusions of the first semiconductor layer are grown again in the windows; secondly, a $Si_3N_4$ layer is grown in situ to serve as the first dielectric layer; thirdly, the first dielectric layer at the positions of the source electrode and the drain electrode is etched, and ohmic contact is prepared; fourthly, the second $hfO_2$ dielectric layers are grown, and the second dielectric layers are only left on the edges of the source electrode and the drain electrode through photoeching photolithography and etching; and finally, the gate electrode is prepared.

Fourth Embodiment

For a novel normally off III-V heterojunction field effect transistor in the embodiment, a substrate material comprises a SiC material and a low-temperature AlN buffer layer grown on the SiC material, a second semiconductor layer (with the thickness of about 2 μm) is a GaN layer, and the first part (with the thickness of about 3 nm) of a first semiconductor layer body is an AlN layer. A dielectric template layer is a $SiO_2$ layer which is grown through LPCVD, the number n of windows on the dielectric template layer is two, then m is three, the length of each window in the connection direction of a source electrode and a drain electrode is 0.5 μm, and the length of each window in the direction perpendicular to the direction of the connection direction of the source electrode and the drain electrode is 20 μm. A first dielectric layer is a $Si_3N_4$ layer which is grown in situ, and the thickness of the first dielectric layer is about 10 nm; each second dielectric layer is an $hfO_2$ layer, and the thickness of each second dielectric layer is 100 nm. The source electrode and the drain electrode are all formed by Ti/Al/Ni/Au (20/120/50/200 nm) through metal deposition and high-temperature thermal annealing. The distance between the source electrode and the drain electrode is 2.5 μm. The edges of the sides, towards the center of a channel, of the second dielectric layers are beyond the source electrode and the drain electrode respectively by the length of 0.5 μm. A gate electrode is prepared from Ni/Au (50/150 nm).

Fifth Embodiment

For the novel enhancement-mode III-V heterojunction field effect transistor structurally provided with a composite barrier layer in the embodiment, a substrate material comprises a Si material and a low-temperature AlN buffer layer grown on the Si material, a second semiconductor layer (with the thickness of about 2 μm) is a GaN layer, the body part (with the thickness of about 3 nm) of a first semiconductor layer is AlN, an AlN intermediate layer (with the thickness of about 1 nm) is arranged between the second semiconductor layer and the body part of the first semiconductor layer and used for improving the electrical property of 2DEG each dielectric wall is a $SiO_2$ layer which is grown through low-pressure chemical vapor deposition (LPCVD), the number n of the dielectric walls is two, then the number m of protrusions is one, the length of a window in the connection direction of a source electrode and a drain electrode is 0.5 μm, and the length of the window in the direction perpendicular to the connection direction of the source electrode and the drain electrode is 100 μm. A first dielectric layer is a $Si_3N_4$ layer which is grown in situ, and the thickness of the first dielectric layer is about 10 nm. The source electrode and the drain electrode are all formed by Ti/Al/Ni/Au (20/120/50/200 nm) through metal deposition and high-temperature thermal annealing. The distance between the source electrode and the drain electrode is 2.5 μm. A gate electrode is prepared from Ni/Au (50/150 nm).

Six Embodiment

For the novel enhancement-mode III-V heterojunction field effect transistor structurally provided with a composite barrier layer in the embodiment, a substrate material comprises a SiC material and a low-temperature AlN buffer layer grown on the SiC material, a second semiconductor layer (with the thickness of about 2 μm) is a GaN layer, and the first part (with the thickness of about 3 nm) of a first semiconductor layer is an AlN layer. Each dielectric wall is a $SiO_2$ layer which is grown through LPCVD, the number n of the dielectric wall is one, then the number m of the protrusion is one, the length of a window in the connection direction of a source electrode and a drain electrode is 0.5 μm, and the length of the window in the direction perpendicular to the connection direction of the source electrode and the drain electrode is 20 μm. A first dielectric layer is a $Si_3N_4$ layer which is grown in situ, and the thickness of the first dielectric layer is about 10 nm. The source electrode and the drain electrode are all formed by Ti/Al/Ni/Au (20/120/50/200 nm) through metal deposition and high-temperature thermal annealing. The distance between the source electrode and the drain electrode is 2.5 μm. A gate electrode is prepared from Ni/Au (50/150 nm).

The above embodiments are only used for assisting in understanding the method and the core concept of the present application. It should be pointed out that various improvements and modifications of the present application made by those ordinary in the field without deviating from the principle of the present application are also within the protection scope of the claims of the present application. The modifications of the embodiments are obvious for those skilled in the field, and the general principle defined by the present application can be realized in other embodiments without deviating from the spirit or the scope of the present application. Therefore, the present application is not limited to the embodiments provided above and can be as wide as possible to include all embodiments consistent with the principle and novel characteristics disclosed by the present application.

What is claimed is:

1. A novel III-V heterojunction field effect transistor, characterized by comprising a substrate layer, a second semiconductor layer, a first semiconductor layer, a drain electrode, a source electrode, a first dielectric layer, second dielectric layers and a gate electrode, wherein, the second semiconductor layer is formed on the substrate layer, the second semiconductor layer and the first semiconductor layer are combined to form a heterostructure, the first semiconductor layer has a greater bandgap compared with the second semiconductor layer, the drain electrode and the source electrode are constructed on the second semiconductor layer, and the drain electrode and the source electrode are connected through the first semiconductor layer and are in Ohmic contact with the first semiconductor layer, so that a channel is formed;

the thickness of the first semiconductor layer is not greater than the critical thickness of 2DEG formed on the heterostructure, and thus natural 2DEG in the heterostructure is depleted;

the first dielectric layer is further arranged on the surface of the first semiconductor layer, the gate electrode is arranged on the first dielectric layer and covers the channel in the full length direction, and the two edges of the gate electrode extend out of the edges of the sides, close to the channel, of the drain electrode and the source electrode respectively; the second dielectric layers are arranged between the gate electrode and the drain electrode as well as between the gate electrode and the source electrode.

2. The novel III-V heterojunction field effect transistor according to claim 1, characterized in that the second dielectric layers are only located on the edges, overlapping with the drain electrode and the source electrode, of the gate electrode.

3. The novel III-V heterojunction field effect transistor according to claim 1, characterized in that an intermediate layer used for improving the mobility of two-dimensional electron gas on the heterojunction interface is further arranged between the first semiconductor layer and the second semiconductor layer, and preferably, the intermediate layer is an AlN layer.

4. The novel III-V heterojunction field effect transistor according to claim 1, characterized in that the first semiconductor layer is an AlGaN layer or an AlN layer, and the second semiconductor layer is a GaN layer.

5. The novel III-V heterojunction field effect transistor according to claim 1, characterized in that the thickness of the first semiconductor layer is smaller than 5 nm and preferably is 1~5 nm.

6. The novel III-V heterojunction field effect transistor according to claim 1, characterized in that the first dielectric layer is a $Si_3N_4$ layer which is grown in situ when a heterostructure material is grown, and the thickness of the first dielectric layer is 5~25 nm.

7. The novel III-V heterojunction field effect transistor according to claim 1, characterized in that a third dielectric layer is further arranged between the gate electrode and the first dielectric layer.

8. The novel III-V heterojunction field effect transistor according to claim 1, characterized in that each second dielectric layer is a $SiO_2$ layer.

9. The novel III-V heterojunction field effect transistor according to claim 1, characterized in that the edges of the sides, towards the channel, of the second dielectric layers are beyond the drain electrode and the source electrode respectively by the length of 0~2 μm.

10. A novel III-V heterojunction field effect transistor, characterized by comprising a substrate layer, a first semiconductor layer, a second semiconductor layer, a dielectric template layer, a drain electrode, a source electrode, a first dielectric layer, second dielectric layers and a gate electrode, wherein, the second semiconductor layer is formed on the substrate layer, and the drain electrode and the source electrode are constructed on the second semiconductor layer; the second semiconductor layer and the first semiconductor layer body are combined to form a heterojunction channel, and the two ends of the heterojunction channel are connected with the drain electrode and the source electrode respectively; the thickness of the first semiconductor layer body is not greater than the critical thickness of 2DEG formed on the heterojunction channel, and thus natural 2DEG in the heterojunction channel is depleted;

the first semiconductor layer comprises a body and n parts of protrusions grown along the body, wherein n≥1;

the dielectric template layer is arranged on the first semiconductor layer body and provided with n windows, and the n parts of protrusions are grown along the n windows; through the protrusions, the thickness of the first semiconductor layer exceeds the critical thickness, so that 2DEG is formed in the projection regions of the protrusions, and n 2DEG regions are formed on the heterojunction channel at intervals; the gate electrode is arranged on the first dielectric layer.

11. The novel III-V heterojunction field effect transistor according to claim 10, characterized in that the two edges of the gate electrode extend out of the edges of the sides, close to the channel, of the drain electrode and the source electrode respectively; the second dielectric layers are arranged between the gate electrode and the drain electrode as well as between the gate electrode and the source electrode respectively.

12. The novel III-V heterojunction field effect transistor according to claim 10, characterized in that the dielectric template layer is arranged on the first semiconductor layer body and provided with n windows at equal intervals, and n 2DEG regions are formed on the heterojunction channel at equal intervals.

13. The novel III-V heterojunction field effect transistor according to claim 10, characterized in that in the gate length direction, a dielectric wall is distributed between at least two adjacent widows in the dielectric template layer, and the dimension of at least one dielectric wall in the gate width direction is equal to or greater than the gate width; the protrusions are grown on the first semiconductor layer body along the outer sides of the dielectric walls; through the protrusion, the thickness of the first semiconductor layer exceeds the critical thickness, so that 2DEG is formed in the projection regions of the protrusions, and at least two discontinuous 2DEG regions, namely the connected parts of the edges of the source electrode and the drain electrode, are formed on the heterojunction channel; the gate electrode only covers the two-dimensional electron gas interruption parts in the whole heterojunction channel.

14. The novel III-V heterojunction field effect transistor according to claim 10, characterized in that the protrusions are distributed continuously or divided into m parts in the growth direction, and m≥1.

15. The novel III-V heterojunction field effect transistor according to claim 10, characterized in that the second dielectric layers are only located on the edges, overlapping with the drain electrode and the source electrode, of the gate electrode.

16. The novel III-V heterojunction field effect transistor according to claim 10, characterized in that an intermediate layer used for improving the mobility of 2DEG on the heterojunction interface is further arranged between the first semiconductor layer and the second semiconductor layer, and preferably, the intermediate layer is an AlN layer.

17. The novel III-V heterojunction field effect transistor according to claim 10, characterized in that the first semiconductor layer is an AlGaN layer of an AlN layer, and the second semiconductor layer is a GaN layer.

18. The novel III-V heterojunction field effect transistor according to claim 10, characterized in that the first dielectric layer is further arranged on the surface of the first semiconductor layer, and the gate electrode is arranged on the first dielectric layer.

19. The novel III-V heterojunction field effect transistor according to claim 18, characterized in that the first dielectric layer is a $Si_3N_4$ layer which is grown in situ when a heterostructure material is grown, and the thickness of the first dielectric layer is 5~25 nm.

20. The novel III-V heterojunction field effect transistor according to claim 10, characterized in that the dielectric template layer or each second dielectric layer is a $SiO_2$ layer.

* * * * *